United States Patent
Wang et al.

(10) Patent No.: US 9,954,037 B2
(45) Date of Patent: Apr. 24, 2018

(54) DISPLAY DEVICE, METHOD OF MANUFACTURING THE SAME, DISPLAY METHOD, AND WEARABLE DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Zhidong Wang, Beijing (CN); Jing Yu, Beijing (CN); Yue Long, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

(*) Notice: Subject to any disclaimer, the term of this patent is extended or adjusted under 35 U.S.C. 154(b) by 0 days.

(21) Appl. No.: 15/207,005

(22) Filed: Jul. 11, 2016

(65) Prior Publication Data
US 2017/0104041 A1    Apr. 13, 2017

(30) Foreign Application Priority Data
Oct. 13, 2015    (CN) .......................... 2015 1 0657900

(51) Int. Cl.
*H01L 27/32* (2006.01)
*B81B 7/00* (2006.01)
(Continued)

(52) U.S. Cl.
CPC .......... *H01L 27/3225* (2013.01); *B81B 7/008* (2013.01); *B81C 1/00246* (2013.01);
(Continued)

(58) Field of Classification Search
CPC combination set(s) only.
See application file for complete search history.

(56) References Cited

U.S. PATENT DOCUMENTS

2008/0003784 A1* 1/2008 Pan ..................... B81C 1/00246
438/479
2010/0123384 A1   5/2010 Miller et al.
(Continued)

FOREIGN PATENT DOCUMENTS

CN          101118313 A     2/2008
CN          102272974 A    12/2011
(Continued)

OTHER PUBLICATIONS

First Office Action regarding Chinese Application No. 201510657900.8, dated Aug. 28, 2017. Translation provided by Dragon Intellectual Property Law Firm.
(Continued)

*Primary Examiner* — Ratisha Mehta
(74) *Attorney, Agent, or Firm* — Harness, Dickey & Pierce, P.L.C.

(57) ABSTRACT

The present disclosure discloses a display device, a method of manufacturing the same, a display method, and a wearable device. The display includes a first base substrate; a low-temperature polysilicon (LTPS) back plate formed on the first base substrate and provided with a switch control circuit; and a micro-electro-mechanical system (MEMS) microlens array formed at a non-display region of the first base substrate, wherein the MEMS microlens array is configured to reflect light emitted by a light-emitting structure at the display region, and the switch control circuit is configured to control the MEMS microlens array to be turned on and off; and the light-emitting structure formed at the display region of the first base substrate.

20 Claims, 12 Drawing Sheets

(51) Int. Cl.
*B81C 1/00* (2006.01)
*H01L 51/00* (2006.01)

(52) U.S. Cl.
CPC ...... *H01L 27/3246* (2013.01); *H01L 51/0096* (2013.01); *B81B 2201/042* (2013.01); *B81B 2207/015* (2013.01); *B81C 2203/0721* (2013.01)

(56) References Cited

U.S. PATENT DOCUMENTS

| | | |
|---|---|---|
| 2011/0111545 A1 | 5/2011 | El-Gamal |
| 2014/0301044 A1* | 10/2014 | Oh ........................ G06F 1/1637 361/749 |
| 2016/0334911 A1* | 11/2016 | Kimura ................. G06F 3/0412 |
| 2016/0363762 A1* | 12/2016 | Yamamoto ........... G02B 5/0247 |
| 2017/0090182 A1* | 3/2017 | Steyn .................. H01L 27/1259 |

FOREIGN PATENT DOCUMENTS

| | | |
|---|---|---|
| CN | 102708760 A | 10/2012 |
| WO | WO-2010003228 A1 | 1/2010 |

OTHER PUBLICATIONS

Jen, Ko-Ruey et al., "A True Circular Flexible AMOLED Display for Wearable Applications", SID 2015 Digest, pp. 1759-1762.

* cited by examiner

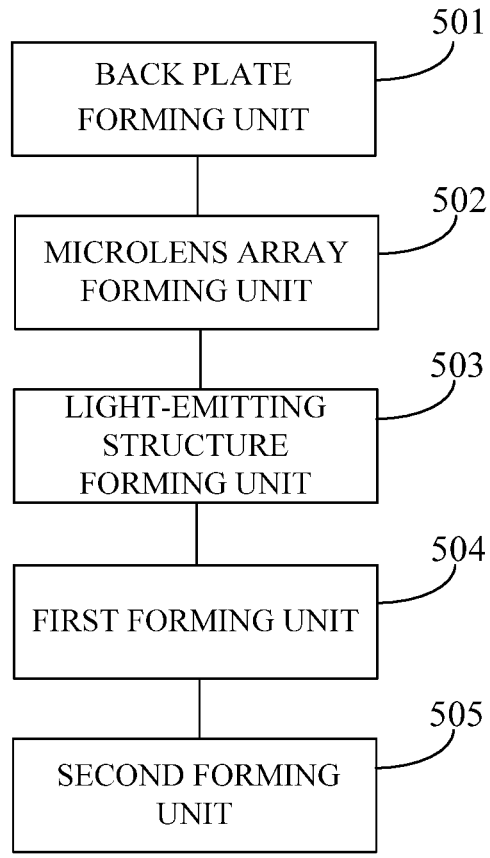

Fig. 5-3

| WHEN AN IMAGE IS DISPLAYED, CONTROLLING VOLTAGES OF AN UPPER ELECTRODE, A FIRST LOWER ELECTRODE AND A SECOND LOWER ELECTRODE, BY USING A SWITCH CONTROL CIRCUIT, SO AS TO ENABLE THE UPPER ELECTRODE TO ROTATE TO A POSITION WHERE LIGHT FROM A LIGHT-EMITTING STRUCTURE AT A DISPLAY REGION IS REFLECTED | 601 |
|---|---|
| WHEN THE IMAGE IS NOT DISPLAYED, CONTROLLING VOLTAGES OF THE UPPER ELECTRODE, THE FIRST LOWER ELECTRODE AND THE SECOND LOWER ELECTRODE, BY USING THE SWITCH CONTROL CIRCUIT, SO AS TO ENABLE THE UPPER ELECTRODE TO ROTATE TO A POSITION WHERE THE LIGHT FROM THE LIGHT-EMITTING STRUCTURE AT THE DISPLAY REGION IS NOT REFLECTED | 602 |

Fig. 6

DISPLAY DEVICE, METHOD OF MANUFACTURING THE SAME, DISPLAY METHOD, AND WEARABLE DEVICE

CROSS-REFERENCE TO RELATED APPLICATION

The present disclosure claims a priority of the Chinese Patent Application No. 201510657900.8 filed on Oct. 13, 2015, which is incorporated herein by reference in its entirety.

TECHNICAL FIELD

The present disclosure relates to the field of the display technology, in particular to a display device, a method of manufacturing the same, a display method, and a wearable device.

BACKGROUND

Along with a rapid development of the mobile communication technology, more and more electronic products such as a wearable device have mobile communication functions. Due to features such as simpleness, quickness and humanization, the wearable device has evoked widespread concerns. Most of the display devices of the wearable device use an organic light-emitting diode (OLED) display technique to display an image. The OLED display technique is realized mainly by means of the low temperature ploy silicon (LTPS) technique.

The display region of the wearable device generally is not in the form of a regular rectangle. Although pixels may be arranged to be nearly circular, they cannot be formed in a shape of a circle. The pixels at the periphery of the display region are arranged in a stair-step shape. Thus, when the display device displays the image, the periphery of the image takes the form of sawteeth, which directly affects a display effect of the image. Therefore, the display quality is poor.

SUMMARY

An object of the present disclosure is to provide a display device, a method of manufacturing the same, a display method, and a wearable device, so as to improve the display quality of the display device.

In one aspect, the present disclosure provides in some embodiments a display device. The display device includes a first base substrate, which includes a display region and a non-display region; a low-temperature polysilicon (LTPS) back plate formed on the first base substrate and provided with a switch control circuit; a micro-electro-mechanical system (MEMS) microlens array formed at the non-display region, wherein the MEMS microlens array is configured to reflect light emitted by a light-emitting structure at the display region, and the switch control circuit is configured to control the MEMS microlens array to be turned on and off; and the light-emitting structure formed at the display region.

Alternatively, the micro-electro-mechanical system (MEMS) microlens array includes a first lower electrode and a second lower electrode that are provided at the non-display region of the first base substrate; a support pillar formed on the first base substrate and provided between the first lower electrode and the second lower electrode; and an upper electrode formed on the support pillar and rotatable by a preset angle under the control of the switch control circuit so as to reflect the light from the display region.

Alternatively, the display device further includes a second base substrate formed on the light-emitting structure.

Alternatively, the support pillar is made of polycrystalline silicon, silicon dioxide or aluminum.

Alternatively, the light-emitting structure is an electroluminescent structure.

Alternatively, the light-emitting structure includes an electrode layer and a light-emitting layer made of a luminescent material.

Alternatively, the LTPS back plate includes a shielding layer made of metal, a buffer layer, a polysilicon layer, a gate insulation layer, an intermediate insulation layer, a passivation layer, source and drain electrodes, a gate electrode, and a planarization layer.

In another aspect, the present disclosure provides in some embodiments a method of manufacturing a display device. This method includes the following steps: forming a low-temperature polysilicon (LTPS) back plate on a first base substrate, the LTPS back plate being provided with a switch control circuit; forming a micro-electro-mechanical system (MEMS) microlens array at a non-display region of the first base substrate, wherein the MEMS microlens array is configured to reflect light emitted by a light-emitting structure at a display region, and the switch control circuit is configured to control the MEMS microlens array to be turned on and off; and forming the light-emitting structure at the display region of the first base substrate.

Alternatively, the step of forming the MEMS microlens array at the non-display region of the first base substrate includes forming a lower electrode pattern at the non-display region of the first base substrate; patterning the first base substrate provided with the lower electrode pattern to form a first lower electrode and a second lower electrode, wherein a gap is formed between the first lower electrode and the second lower electrode; forming a sacrificial layer on the first base substrate provided with the first lower electrode and the second lower electrode; removing a part of the sacrificial layer to form a residual sacrificial layer and a cavity defined by the first lower electrode, the second lower electrode, the residual sacrificial layer and the (LTPS back plate, wherein a width of the cavity is equal to that of the gap between the first lower electrode and the second lower electrode; filling the cavity with a supporting material to form a support pillar; forming an upper electrode on the first base substrate provided with the support pillar; and removing the residual sacrificial layer to form the MEMS microlens array.

Alternatively, the support material is selected from polycrystalline silicon, silicon dioxide or aluminum.

Alternatively, the method of manufacturing a display device further includes the steps: forming a second base substrate on the first base substrate provided with the light-emitting structure; and forming the display device by an OLED evaporation technique and an OLED packaging technique.

In a yet another aspect, the present disclosure provides in some embodiments an apparatus for manufacturing a display device, which includes a back plate forming unit, which is configured to form a low-temperature polysilicon (LTPS) back plate on a first base substrate, the LTPS back plate being provided with a switch control circuit; a microlens array forming unit, which is configured to form a micro-electro-mechanical system (MEMS) microlens array at a non-display region of the first base substrate, wherein the MEMS microlens array is configured to reflect light emitted by the light-emitting structure of the display region, and the switch control circuit is configured to control the MEMS microlens array to be turned on and off; and a light-emitting structure forming unit, which is configured to form the light-emitting structure at the display region of the first base substrate.

In a still yet another aspect, the present disclosure provides in some embodiments a display method for the display device, including: when an image is displayed, controlling voltages of an upper electrode, a first lower electrode and a second lower electrode by using a switch control circuit so as to enable the upper electrode to rotate to a position where light from a light-emitting structure at a display region is reflected; and when the image is not displayed, controlling voltages of the upper electrode, the first lower electrode and the second lower electrode by using the switch control circuit so as to enable the upper electrode to rotate to a position where the light from the light-emitting structure at the display region is not reflected.

Alternatively, the step of controlling voltages of the upper electrode, the first lower electrode and the second lower electrode by using the switch control circuit so as to enable the upper electrode to rotate to the position where the light from the light-emitting structure at the display region is reflected includes applying charges of different polarities to the upper electrode and the first lower electrode while not applying charges to the second lower electrode, by using the switch control circuit, so as to enable the upper electrode to rotate to the position where the light from the light-emitting structure at the display region is reflected; or applying the charges of different polarities to the upper electrode and the first lower electrode while applying charges of a same polarity as the upper electrode to the second lower electrode, by using the switch control circuit, so as to enable the upper electrode to rotate to the position where the light from the light-emitting structure at the display region is reflected.

Alternatively, the upper electrode is rotated by a preset angle in a direction close to the display region.

Alternatively, the preset angle is equal or greater than zero degree and is less than or equal to 12 degrees.

Alternatively, the step of controlling voltages of the upper electrode, the first lower electrode and the second lower electrode by using the switch control circuit so as to enable the upper electrode to rotate to the position where the light from the light-emitting structure at the display region is not reflected includes applying charges of different polarities to the upper electrode and the second lower electrode while not applying the charges to the first lower electrode, by using the switch control circuit, so as to enable the upper electrode to rotate to the position where the light from the light-emitting structure at the display region is not reflected; or applying charges of different polarities to the upper electrode and the second lower electrode while applying charges of a same polarity as the upper electrode to the first lower electrode, by using the switch control circuit, so as to enable the upper electrode to rotate to the position where the light from the light-emitting structure at the display region is not reflected.

Alternatively, the upper electrode is rotated by a preset angle in a direction away from the display region.

Alternatively, the preset angle is equal or greater than zero degree and is less than or equal to 12 degrees.

In a still yet another aspect, the present disclosure provides in some embodiments a wearable device, which includes the above display device.

The present disclosure discloses the display device, the method of manufacturing the same, the apparatus for manufacturing the same, the display method, and the wearable device. As mentioned above, the first base substrate of the display device is provided with the LTPS back plate, the micro-electro-mechanical system (MEMS) microlens array for reflecting light from the light-emitting structure at the display region is formed at the non-display region of the first base substrate, and the MEMS microlens array can be controlled to be turned on and off under the control of the switch control circuit of the LTPS back plate. As a result, the light at the peripheral region of the display region is darker than that in the display region. Compared with the relevant arts, although the pixels at the peripheral region of the display region are arranged in a stair-step shape, since a natural transition region is formed between the display region and the surrounding environment, the sawteeth phenomenon at the periphery of the image can be effectively removed. Therefore, the display quality of the image is improved.

It should be understood that, the above general description and the following detailed description are for illustrative purposes only, but cannot limit the scope of the present disclosure.

DESCRIPTION OF THE DRAWINGS

In order to illustrate the technical solutions in embodiments of the present disclosure in a clearer manner, the drawings used in the embodiments will be described hereinafter briefly. Obviously, the following drawings merely relate to some embodiments of the present disclosure, and based on these drawings, a person skilled in the art may obtain the other drawings without any creative effort.

FIGS. 2-1 to 2-6 are schematic views showing a display device according to embodiments of the present disclosure;

FIG. 2-7 is a top view showing a display region and a non-display region of a display device according to embodiments of the present disclosure;

FIG. 3 is a flow chart showing a method for manufacturing a display device according to embodiments of the present disclosure;

FIG. 4-1 is another flow chart showing the method for manufacturing a display device according to embodiments of the present disclosure;

FIG. 4-2 is a schematic view showing an LTPS back plate according to embodiments of the present disclosure;

FIG. 4-3 is a schematic view showing a MEMS microlens array according to embodiments of the present disclosure;

FIG. 4-4 is a flow chart showing a method for manufacturing the MEMS microlens array according to embodiments of the present disclosure;

FIG. 4-5 is a schematic view showing a lower electrode pattern according to embodiments of the present disclosure;

FIG. 4-6 is a schematic view showing a first lower electrode and a second lower electrode according to embodiments of the present disclosure;

FIG. 4-7 is a flow chart showing a method for manufacturing the first lower electrode and the second lower electrode according to embodiments of the present disclosure;

FIGS. 4-8 to 4-11 are schematic views showing the manufacture of the first lower electrode and the second lower electrode corresponding to FIG. 4-7;

FIG. 4-12 is a schematic view showing a sacrificial layer according to embodiments of the present disclosure;

FIG. 4-13 is a schematic view showing a residual sacrificial layer according to embodiments of the present disclosure;

FIG. 4-14 is a schematic view showing a support pillar according to embodiments of the present disclosure;

FIG. 4-15 is a schematic view showing a formation of an upper electrode according to embodiments of the present disclosure;

FIG. 4-16 is a schematic view showing a MEMS microlens array after a removal of the residual sacrificial layer according to embodiments of the present disclosure;

FIG. 5-1 is a schematic view showing an apparatus for manufacturing a display device according to embodiments of the present disclosure;

FIG. 5-2 is a schematic view showing a microlens array forming unit according to embodiments of the present disclosure;

FIG. 5-3 is another schematic view showing the apparatus for manufacturing a display device according to embodiments of the present disclosure; and FIG. 6 is a flow chart showing a display method of the display device according to embodiments of the present disclosure.

The embodiments of the present disclosure are illustrated through the above figures, and a more detailed description is hereinafter provided. The above figures and the description are not to limit the scope of the concept of the present disclosure in any arbitrary manner, but to clarify the concept for a person skilled in the art with reference to specific embodiments.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
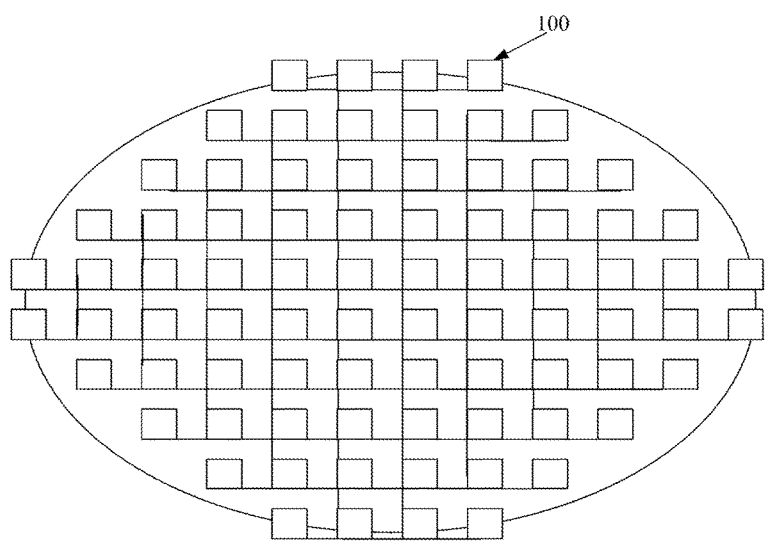
FIG. 1 is a schematic view showing an arrangement of pixels of a display region.

The display region of the display device of the wearable device generally is not in the form of a regular rectangle, but is in an irregular structure such as a circle. The pixel having the above structure is shown in FIG. 1, and specifically, the pixels are arranged to be nearly circular. The reference number 100 in FIG. 1 is a pixel.

The display region of the display device of the wearable device generally is not in the form of a regular rectangle. Although pixels may be arranged to be nearly circular, they cannot be formed in a shape of a circle. The pixels around the display region are arranged in a stair-step shape. Thus, when the display device displays the image, the periphery of the image may be of a sawteeth form, which directly affects a display effect of the image. Therefore, the display quality is poor.

Figures 1, 2:
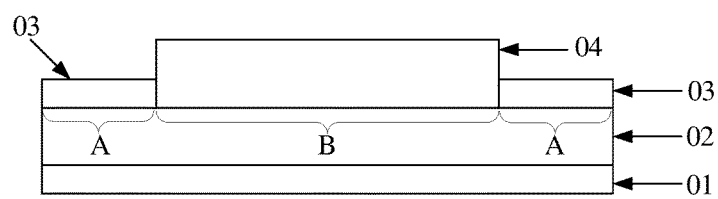
Figure 2:
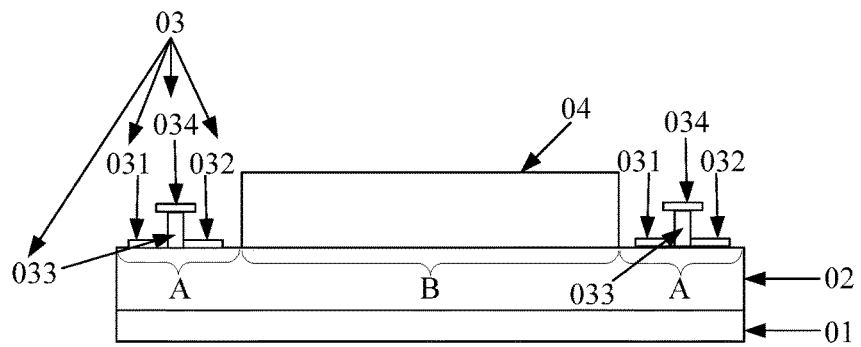

The embodiments of the present disclosure provide a display device. As shown in FIG. 2-1, the display device includes a first base substrate 01, an LTPS back plate 02 formed on the first base substrate 01 and provided with a switch control circuit (not shown in FIG. 2-1); a microelectro-mechanical system (MEMS) microlens array 03 formed at the non-display region A of the first base substrate 01, wherein the MEMS microlens array is configured to reflect the light emitted by a light-emitting structure 04 at the display region B, and the switch control circuit is configured to control the MEMS microlens array to be turned on and off; and the light-emitting structure 04 formed at the display region B of the first base substrate 01.

According to the display device of the embodiments of the present disclosure, the first base substrate of the display device is provided with the LTPS back plate, the MEMS microlens array for reflecting the light emitted by the light-emitting structure at the display region is formed at the non-display region of the first base substrate provided with the LTPS back plate, and the MEMS microlens array can be controlled to be turned on and off under the control of the switch control circuit of the LTPS back plate. As a result, the light at the peripheral region of the display region is darker than that at the display region. Compared with the relevant arts, although the pixels at the peripheral region of the display region are arranged in a stair-step shape, since a natural transition region is formed between the display region and the surrounding environment, the sawteeth phenomenon at the periphery of the image can be effectively removed. Therefore, the display quality of the image is improved.

As shown in FIG. 2-2, the MEMS microlens array 03 includes a first lower electrode 031 and a second lower electrode 032 that are provided at the non-display region A of the first base substrate 01; a support pillar 033 formed between the first lower electrode 031 and the second lower electrode 032; and an upper electrode 034 formed on the support pillar 033. The upper electrode 034 is rotatable by a preset angle under the control of the switch control circuit, so as to reflect the light emitted by the light-emitting structure 04 at the display region B. The MEMS microlens array 03 may include a plurality of MEMS microlens, each of which includes a first lower electrode, a second lower electrode, a support pillar and an upper electrode. Alternatively, the support pillar may be made of polycrystalline silicon, silicon dioxide or aluminum, and the luminous structure is an electroluminescent structure.

Figures 2, 3:
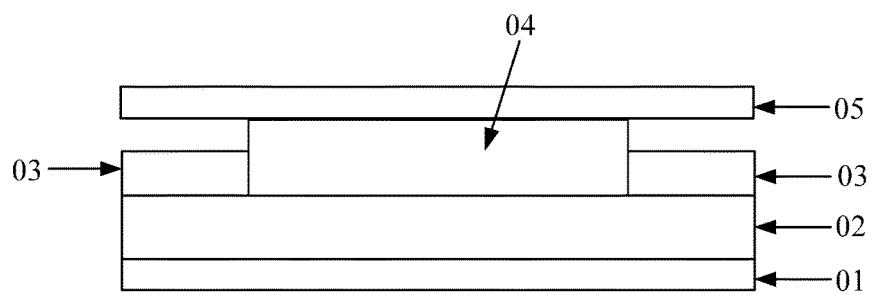

As shown in FIGS. 2-3, the display device further includes a second base substrate 05 formed on the light-emitting structure 04. The reference number 02 in FIG. 2-3 is an LTPS back plate, and the reference number 03 is an MEMS microlens array.

Figures 2, 3, 4:
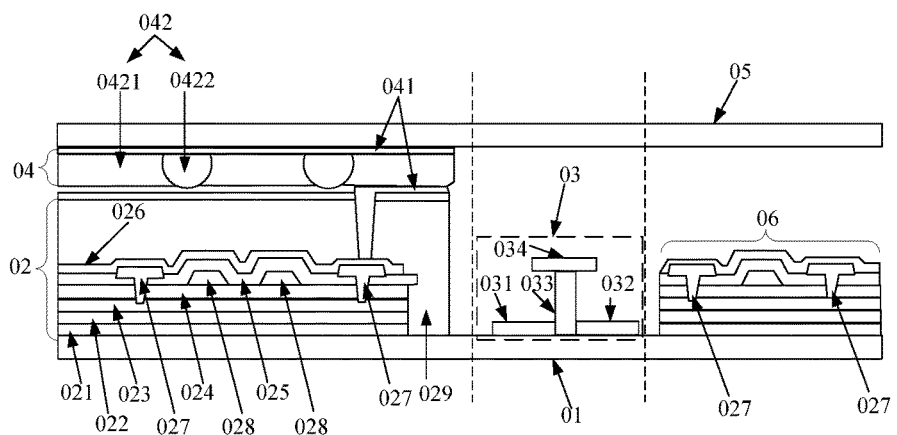

FIGS. 2-4 to 2-6 show a display device. As shown in FIG. 2-4, the display device includes the first base substrate 01, the LTPS back plate 02, the light-emitting structure 04, the MEMS microlens array 03, the switch control circuit 06, and the second substrate base substrate 05. The MEMS microlens array 03 includes a first lower electrode 031 and a second lower electrode 032, a support pillar 033 formed between the first lower electrode 031 and the second lower electrode 032, and an upper electrode 034 on the support pillar 033. The light-emitting structure 04 includes an electrode layer 041 and a light-emitting layer 042 made of a luminescent material. The light-emitting structure may convert electrical energy to optical energy since light can be generated from the luminescent material under the effect of electric field. In FIG. 2-4, the reference number 021 is a shielding metal (SM), the reference number 022 represents a buffer layer (Buffer), the reference number 023 represents a polycrystalline silicon (P—Si), the reference number 024 represents a gate insulation layer (GI), the reference number 025 represents an intermediate insulation layer or an interlayer dielectric (ILD), the reference number 026 represents a passivation (PVX) layer, the reference number 027 represents source and drain electrodes of a film transistor, the reference number 028 represents a gate electrode of the film transistor, the reference number 029 is a planarization layer (PL), the reference number 0421 represents an electroluminescence (EL) pattern, and the reference number 0422 represents a pixel definition layer (PDL).

When an image is displayed, voltages of the upper electrode 034, the first lower electrode 031 and the second lower electrode 032 are controlled by using a switch control circuit 06 so as to enable the upper electrode 034 to rotate to a position where the light from a light-emitting structure 04 at a display region is reflected. Further, the light emitted from the light-emitting structure 04 can be emitted out from the second base substrate 05, as shown in FIG. 2-5. The other reference numbers in FIG. 2-5 can be explained with reference to FIG. 2-4.

When the image is not displayed, voltages of the upper electrode 034, the first lower electrode 031 and the second lower electrode 032 are controlled by using the switch control circuit 06 so as to enable the upper electrode 034 to rotate to a position where the light from the light-emitting structure at the display region is not reflected, as shown in FIG. 2-6. The other reference numbers in FIG. 2-6 can be explained with reference to FIG. 2-4.

It should be noted that, the structural diagrams of the display device shown in FIGS. 2-4 to 2-6 are intend to better illustrate the structure of each of the components, but not intend to show the actual position of each of the components or the size ratios between the components.

FIG. 2-7 is a top view showing the display region and the non-display region of the display device according to embodiments of the present disclosure. The rectangular region in FIG. 2-7 is the display region B, and the region except the rectangular region is the non-display region A. The LTPS back plate (not shown in FIG. 2-7) is arranged at the display region B and the non-display region A, and provided with the switch control circuit. The light-emitting structure (not shown in FIG. 2-7) is provided at the display region B, and the MEMS microlens array 03 is provided at a peripheral region of the display region B (i.e. the non-display region A). The MEMS microlens array 03 is configured to reflect the light emitted by the light-emitting structure at the display region B. It should be noted that, the shape of the display region may be a rectangle, or other shapes such as a circle.

According to the display device of the embodiments of the present disclosure, the light emitted from the display region may be reflected by the MEMS microlens array, so that it is able to prevent the sawteeth phenomenon at the periphery of the image displayed by the irregular display region. Besides, the display device is applicable to all the display devices having narrow frames and with irregular display regions.

To sum up, according to the display device of the embodiments of the present disclosure, the first base substrate is provided with the LTPS back plate, the MEMS microlens array for reflecting the light emitted by the light-emitting structure of the display region is formed at the non-display region of the first base substrate, and the MEMS microlens array can be controlled to be turned on and off under the control of the switch control circuit of the LTPS back plate. As a result, the light at the peripheral region of the display region is darker than that at the display region. Compared with the relevant arts, although the pixels at the peripheral region of the display region are arranged in a stair-step shape, since a natural transition region is formed between the display region and the surrounding environment, the sawteeth phenomenon at the periphery of the image can be effectively removed. Therefore, the display quality of the image and the user experience are effectively improved.

The present disclosure further provides in some embodiments a method of manufacturing a display device. As shown in FIG. 3, the manufacturing method includes the following steps.

Step S301: forming a LTPS back plate on a first base substrate, the LTPS back plate being provided with a switch control circuit.

Step S302: forming a MEMS microlens array at a non-display region of the first base substrate. The MEMS microlens array is configured to reflect the light emitted by a light-emitting structure at a display region, and the switch control circuit is configured to control the MEMS microlens array to be turned on and off.

Step S303: forming the light-emitting structure at the display region of the first base substrate.

In the method of manufacturing the display device according to the embodiments of the present disclosure, the first base substrate of the display device is provided with the LTPS back plate, the MEMS microlens array for reflecting the light emitted by the light-emitting structure of the display region is formed at the non-display region of the first base substrate, and the MEMS microlens array can be controlled to be turned on and off under the control of the switch control circuit of the LTPS back plate. As a result, the light at the peripheral region of the display region is darker than that at the display region. Compared with the relevant arts, although the pixels at the peripheral region of the display region are arranged in a stair-step shape, since a natural transition region is formed between the display region and the surrounding environment, the sawteeth phenomenon at the periphery of the image can be effectively removed. Therefore, the display quality of the image is improved.

The present disclosure further provides in some embodiments another method of manufacturing a display device. As shown in FIG. 4-1, the manufacturing method includes the following steps.

Step S401: forming an LTPS back plate on a first base substrate. As shown in FIG. 4-2, the LTPS back plate 02 is formed on the first base substrate 01 and provided with a switch control circuit (not shown in FIG. 4-2).

Step S402: forming an MEMS microlens array at a non-display region of the first base substrate. As shown in FIG. 4-3, the MEMS microlens array 03 is formed at the non-display region A of the first base substrate 01. The MEMS microlens array is configured to reflect the light emitted by the light-emitting structure at the display region, and the switch control circuit is configured to control the MEMS microlens array to be turned on and off. Referring to FIGS. 2-2 and 2-4, the MEMS microlens array 03 may be formed on the LTPS back plate 02, or can be directly formed on the first base substrate 01. The description will be given below by taking an example where the MEMS microlens array 03 is formed on the LTPS back plate 02.

Specifically, the MEMS microlens array may include a first lower electrode, a second lower electrode, a support pillar and an upper electrode. Correspondingly, as shown in FIG. 4-4, the step 402 may include the following steps.

Figures 2, 3, 4, 5:
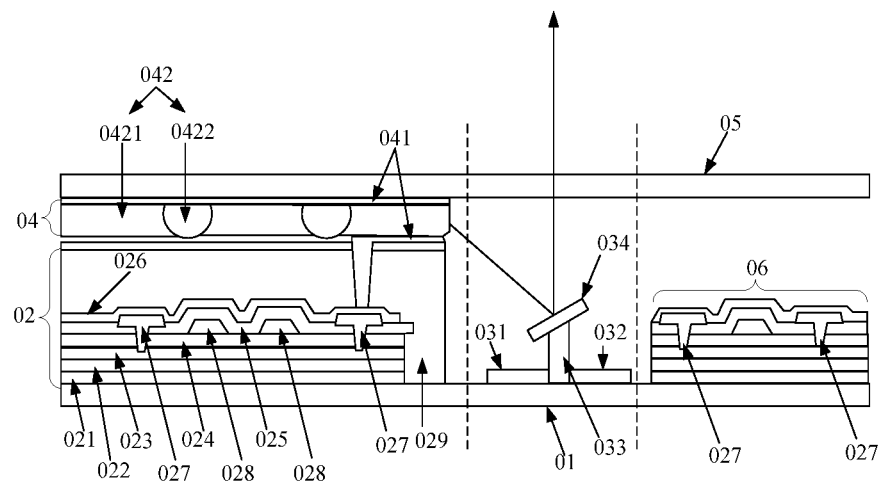

Step S4021: forming a lower electrode pattern at the non-display region of the first base substrate. As shown in FIG. 4-5, the lower electrode pattern 003 is formed at the non-display region A of the first base substrate 01.

Figures 2, 3, 4, 5, 6:
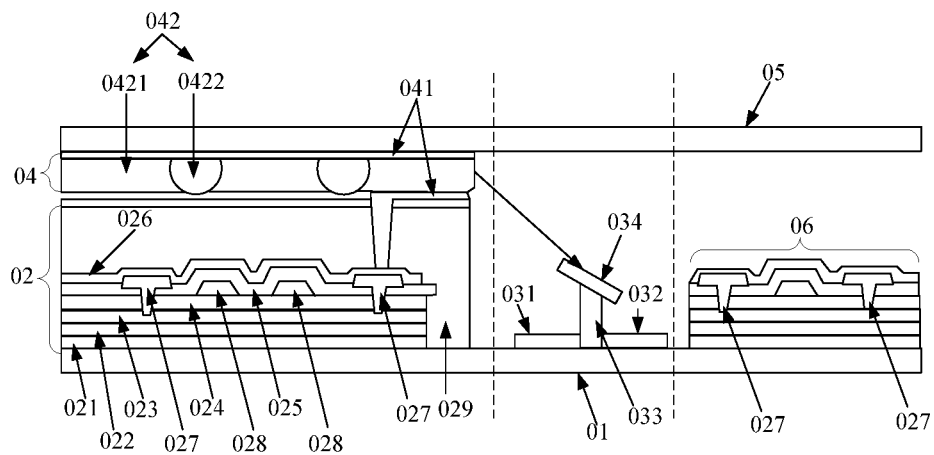
Figures 2, 3, 4, 5, 6, 7:
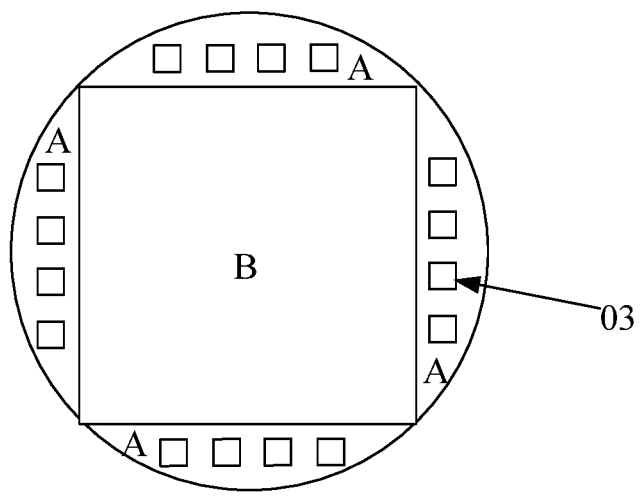
Figure 3:
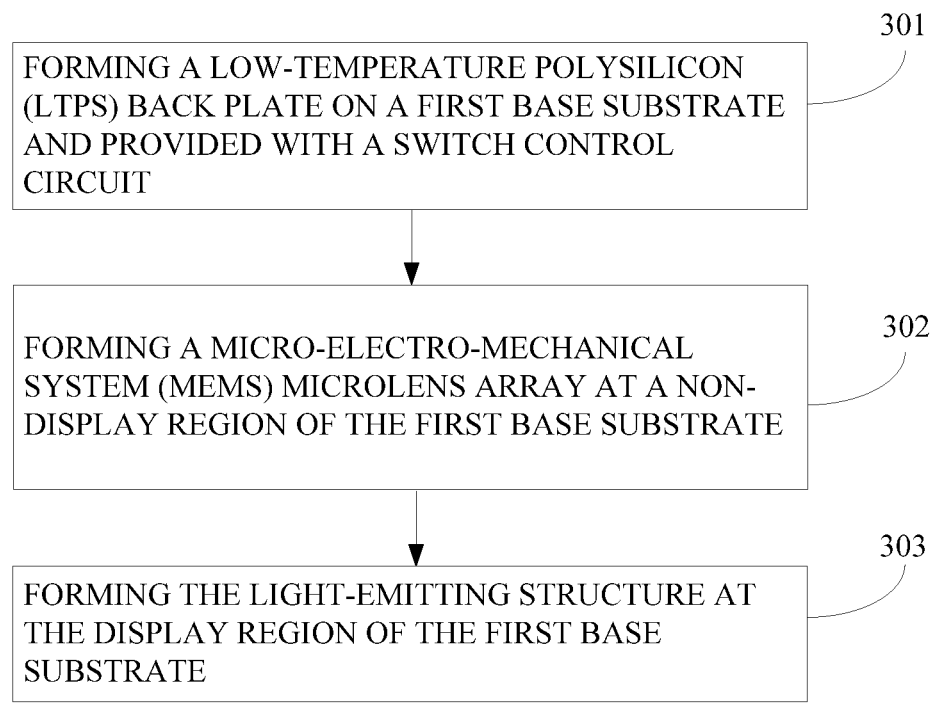

Step S4022: patterning the first base substrate provided with the lower electrode pattern to form a first lower electrode and a second lower electrode. As shown in FIG. 4-6, the first base substrate 01 provided with the lower electrode pattern is patterned to form the first lower electrode 031 and the second lower electrode 032. A gap is formed between the first lower electrode 031 and the second lower electrode 032. The reference number 02 in FIG. 4-6 is an LTPS back plate.

As shown in FIG. 4-7, the step S4022 may include the following steps.

Figures 1, 4:
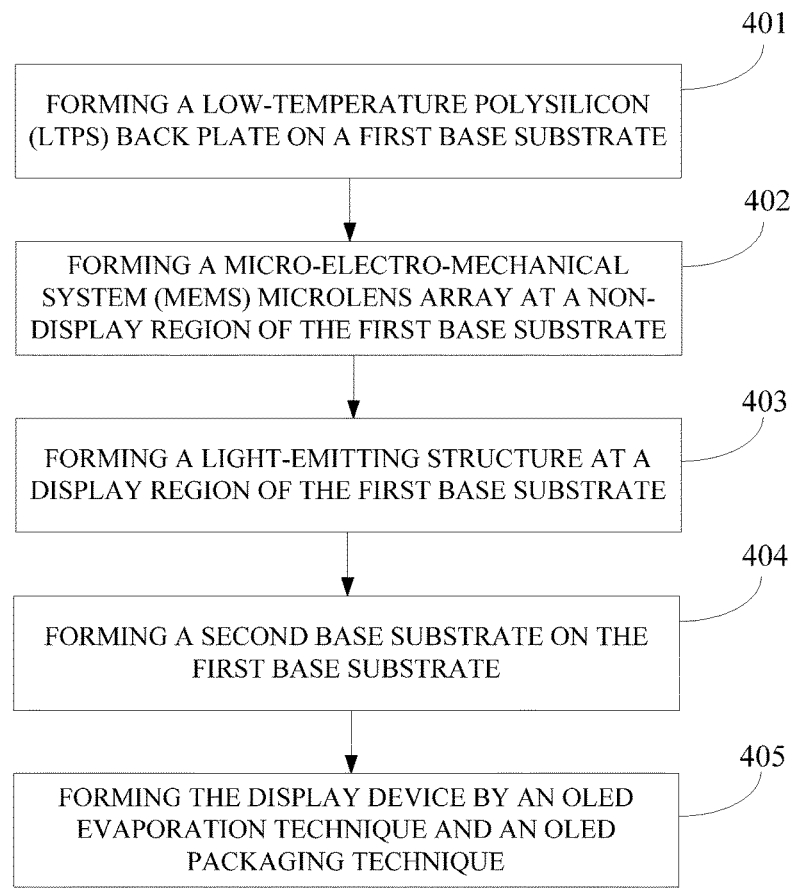
Figures 2, 4:
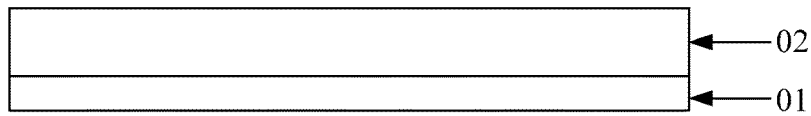
Figures 3, 4:
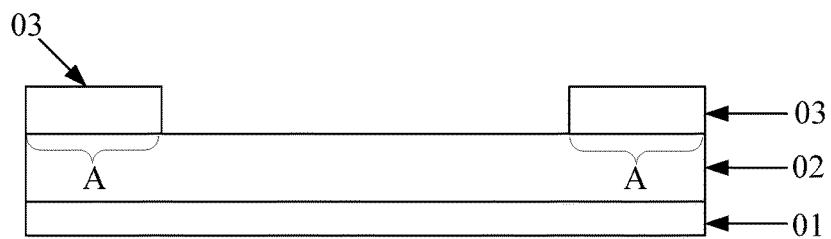
Figure 4:
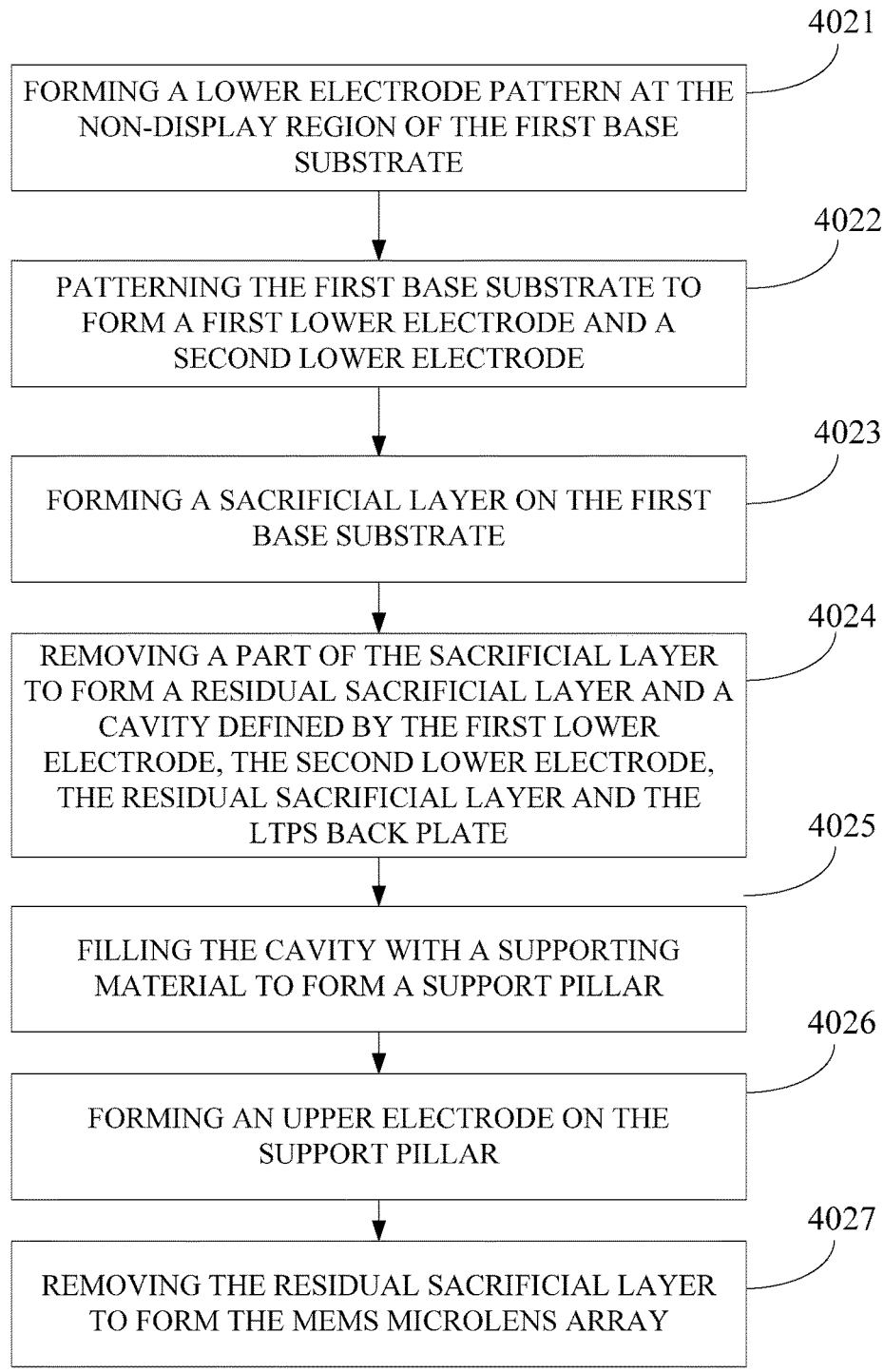
Figures 4, 5:
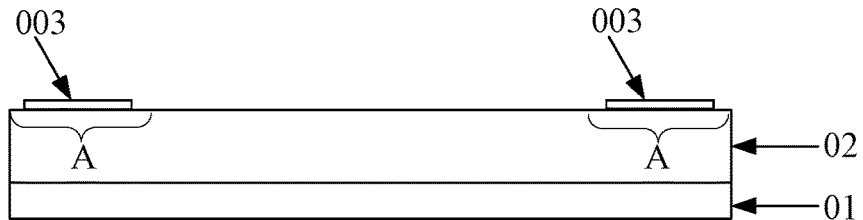
Figures 4, 5, 6:
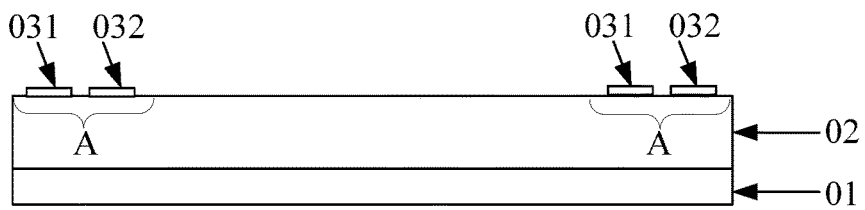
Figures 4, 5, 6, 7:
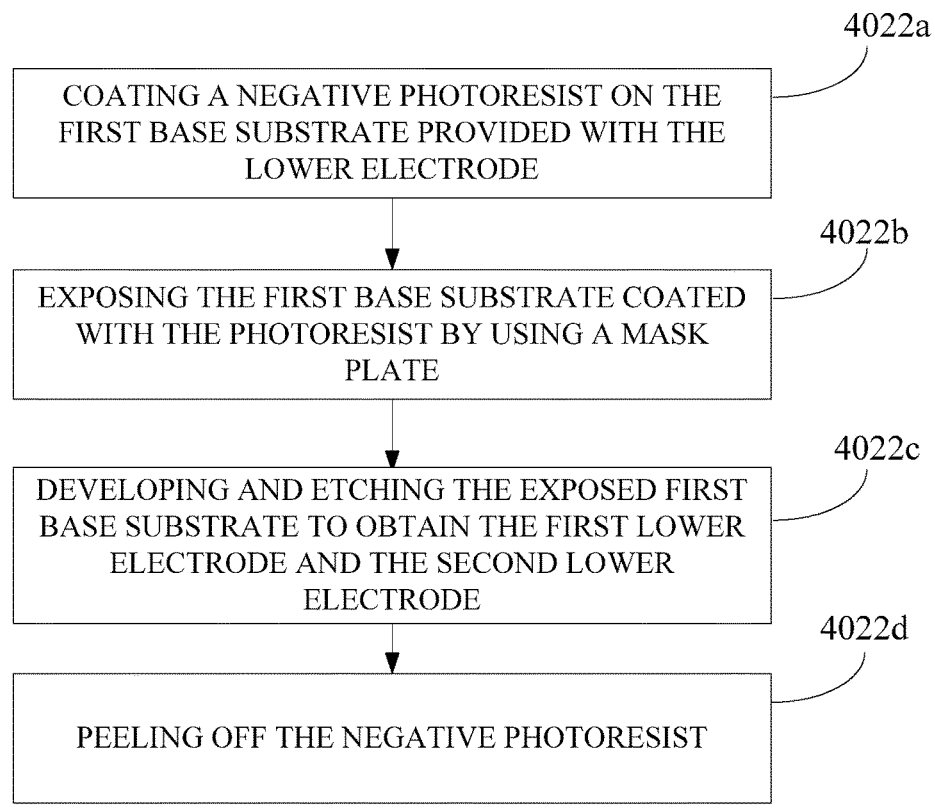
Figures 4, 5, 6, 7, 8:
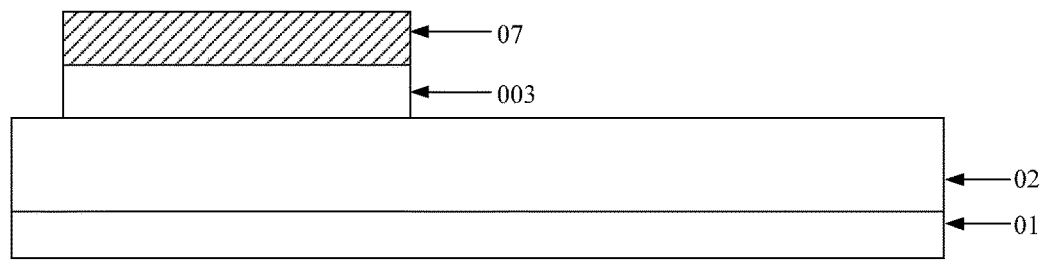
Figures 4, 5, 6, 7, 8, 9:
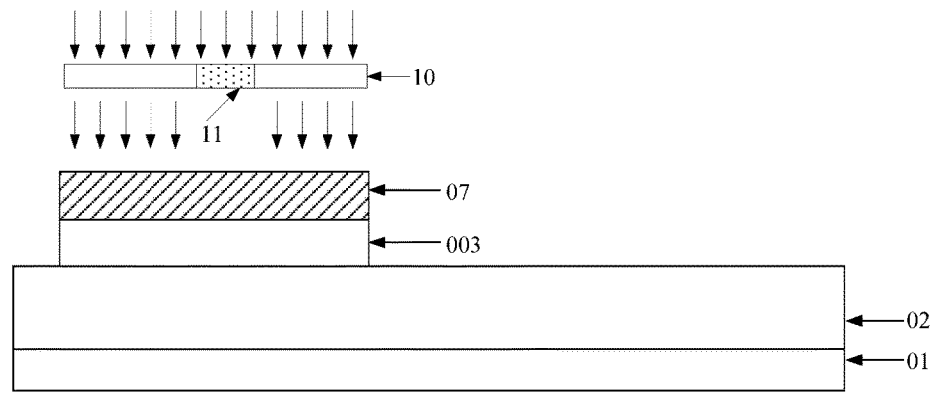
Figures 4, 5, 6, 7, 8, 9, 10:
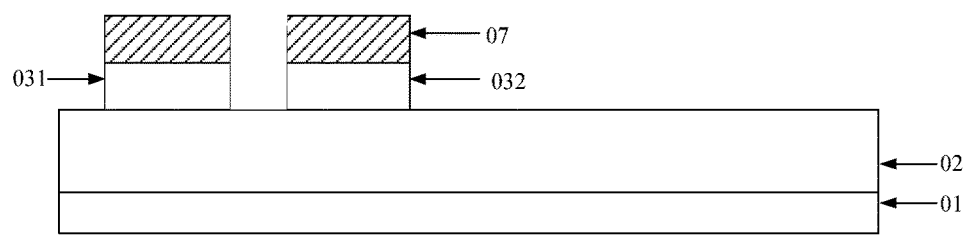

Step S4022a: coating a negative photoresist on the first base substrate provided with the lower electrode pattern. As shown in FIG. 8, a negative photoresist 7 is coated on the first base substrate 01 provided with the lower electrode pattern 003. The reference number 02 in FIG. 4-8 is an LTPS back plate.

Step S4022b: exposing the first base substrate coated with the photoresist by using a mask plate. As shown in FIG. 4-9: the first base substrate 01 coated with the negative photoresist 7 is exposed by using a non-transparent region 11 of the mask plate 10. The process of exposing the first base substrate coated with the photoresist 7 by using the mask plate may refer to the related art and will be omitted herein. The reference number 02 in FIG. 4-9 is an LTPS back plate.

Step 4022c: developing and etching the exposed first base substrate to obtain the first lower electrode and the second lower electrode. As shown in FIG. 4-10, the exposed first base substrate 01 is developed, and the unexposed non-photosensitive negative photoresist 7 is dissolved in a negative photoresist developing liquid. For example, the developing liquid may be butanone, methylbenzene, et al. Then, the developed first base substrate 01 is etched to obtain the first lower electrode 031 and the second lower electrode 032. The reference number 02 in FIG. 4-10 is an LTPS back plate.

Figures 4, 5, 6, 7, 8, 9, 10, 11:
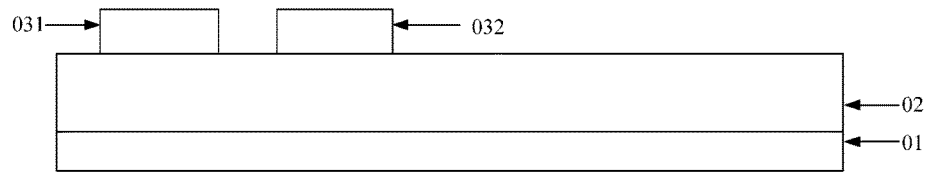
Figures 4, 5, 6, 7, 8, 9, 10, 11, 12:
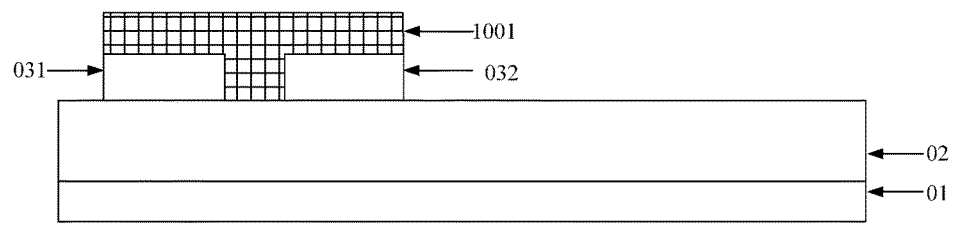
Figures 4, 5, 6, 7, 8, 9, 10, 11, 12, 13:
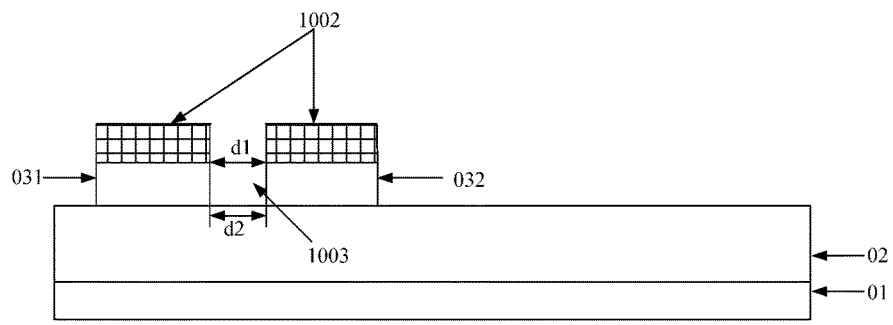
Figures 4, 5, 6, 7, 8, 9, 10, 11, 12, 13, 14:
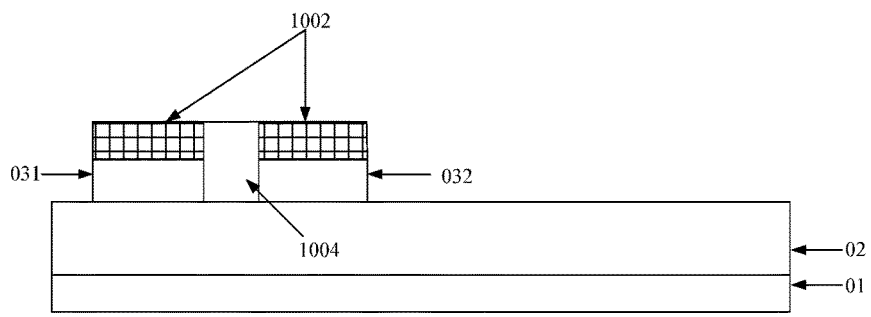
Figures 4, 5, 6, 7, 8, 9, 10, 11, 12, 13, 14, 15:
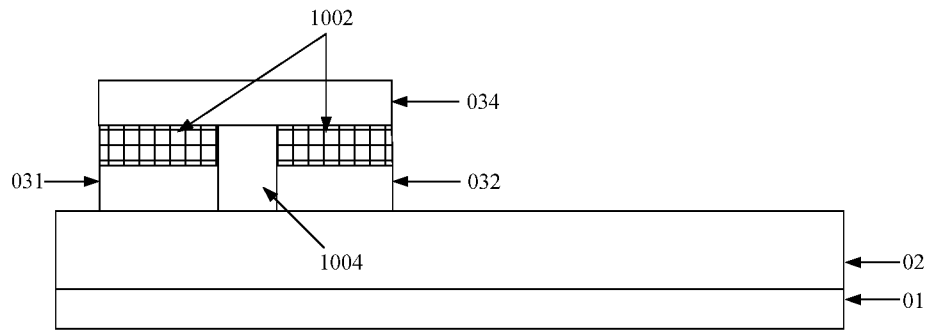
Figures 4, 5, 6, 7, 8, 9, 10, 11, 12, 13, 14, 15, 16:
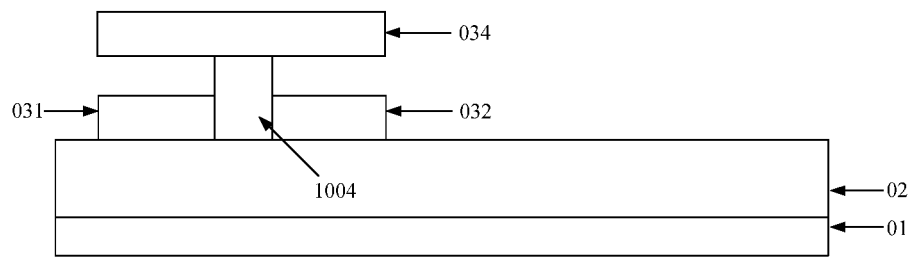
Figures 1, 5:
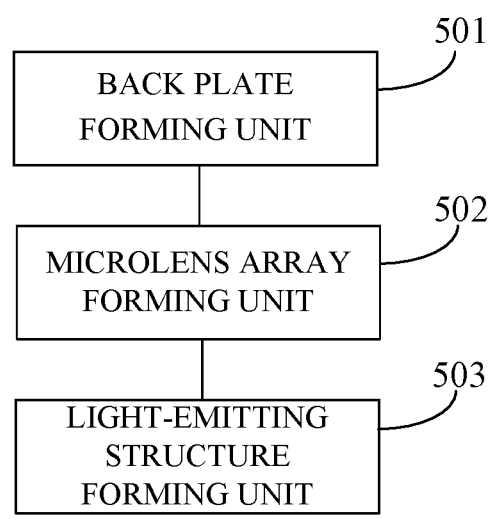
Figures 2, 5:
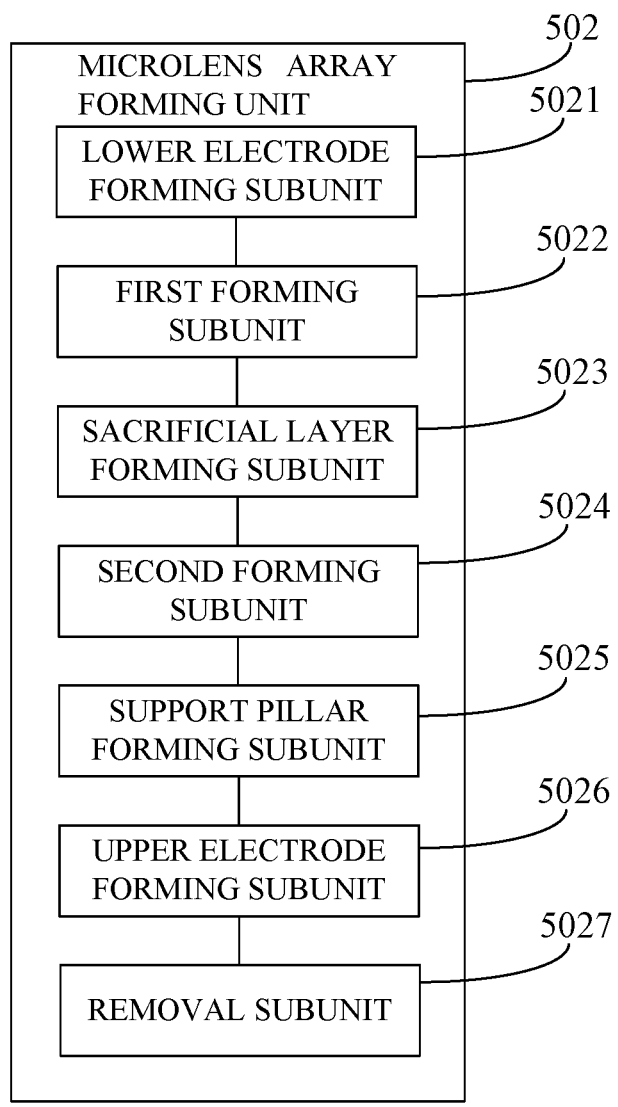

Step S4022d: peeling off the negative photoresist. FIG. 4-11 is a schematic view showing the first base substrate 01 for which the negative photoresist is peeled off. In FIG. 11, the reference number 02 represents the LTPS back plate, the reference number 031 is the first lower electrode, and the reference number 032 is the second lower electrode.

Step S4023: forming a sacrificial layer on the first base substrate provided with the first lower electrode and the second lower electrode. As shown in FIG. 4-12, the sacrificial layer 1001 is formed on the first base substrate 01 provided with the first lower electrode 031 and the second lower electrode 032. In FIG. 4-12, the reference number 02 represents the LTPS back plate.

Step S4024: removing a part of the sacrificial layer to form a residual sacrificial layer and a cavity defined by the first lower electrode, the second lower electrode, the residual sacrificial layer and the LTPS back plate. As shown in FIG. 4-13, the part of the sacrificial layer is removed to form the residual sacrificial layer 1002 and the cavity 1003 defined by the first lower electrode 031, the second lower electrode 032, the residual sacrificial layer 1002 and the LTPS back plate 02. A width d1 of the cavity 1003 is equal to a width d2 of the gap between the first lower electrode 031 and the second lower electrode 032.

Step S4025: filling the cavity with a supporting material to form a support pillar. As shown in FIG. 4-14, the cavity is filled with the supporting material to form the support pillar 1004. For example, the support material is selected from polycrystalline silicon, silicon dioxide or aluminum.

Step S4026: forming an upper electrode on the support pillar. As shown in FIG. 4-15, the upper electrode 034 is formed on the first base substrate 01 provided with the support pillar 1004. In FIG. 4-15, the reference number 02 represents the LTPS back plate, the reference number 031 represents the first lower electrode, the reference number 032 represents the second lower electrode, and the reference number 1002 represents the sacrificial layer.

Step S4027: removing the residual sacrificial layer to form the MEMS microlens array. As shown in FIG. 4-16, the residual sacrificial layer may be removed to form the MEMS microlens array so that the upper electrode 034 can reflect the light emitted by the light-emitting structure of the display region after being rotated by a preset angle under the control of the switch control circuit. Specifically, a corrosive liquid can be used to corrode the residual sacrificial layer, and since the residual sacrificial layer is corroded faster under the effect of the corrosive liquid and the support pillar is corroded more slowly under the effect of the corrosive liquid, the residual sacrificial layer can be effectively removed with the use of the corrosive liquid. In FIG. 4-16, the reference number 01 represents the first base substrate, the reference number 02 represents the LTPS back plate, the reference number 031 represents the first lower electrode, the reference number 032 represents the second lower electrode, and the reference number 1004 represents the support pillar.

It should be noted that, in some embodiments, the MEMS microlens array can be gradually formed at the non-display region of the first base substrate provided with the LTPS back plate according to the step S402, and in some other embodiments, the MEMS microlens array may be formed in advance, and then, the formed MEMS microlens array is formed on the LTPS base plate. If the MEMS microlens array is formed in advance, the step S4021 goes as follows: forming the lower electrode pattern on the base. The other steps may refer to Step S402;

Step S403: forming a light-emitting structure at the display region of the first base substrate provided with the MEMS microlens array. As shown in FIG. 2-1, a light-emitting structure 04 is formed at the display region of the first base substrate 01 provided with the MEMS microlens array 03. For example, the light emitting structure may be an electroluminescent structure. The electroluminescence refers to a physical phenomenon that an electron that is excited by the electric field generated by voltages applied at both electrodes impacts on a luminescence center so as to cause electrons hopping between the energy levels, then changing and compositing so as to finally cause the luminescence. The electroluminescent structure includes an electrode layer and a light-emitting layer;

Step S404: forming a second base substrate on the first base substrate provided with the light-emitting structure. As shown in FIG. 2-3, a second base substrate 05 is formed on the first base substrate 01 provided with the light-emitting structure 04.

Step S405: forming the display device by an OLED evaporation technique and an OLED packaging technique. The OLED evaporation technique and the OLED packaging technique can refer to the related art and will be omitted herein.

For the method of manufacturing a display device according to the embodiments of the present disclosure, the first base substrate of the display device is provided with the LTPS back plate, the MEMS microlens array for reflecting the light emitted by the light-emitting structure of the display region is formed at the non-display region of the first base substrate provided with the LTPS back plate, and the MEMS microlens array can be controlled to be turned on and off under the control of the switch control circuit of the LTPS back plate. As a result, the light at the peripheral region of the display region is darker than that at the display region. Compared with the relevant arts, although the pixels at the peripheral region of the display region are arranged in a stair-step shape, since a natural transition region is formed between the display region and the surrounding environment, the sawteeth phenomenon at the periphery of the image can be effectively removed. Therefore, the display quality of the image and the user experience are effectively improved.

The present disclosure further provides in some embodiments an apparatus for manufacturing a display device. As shown in FIG. 5-1, the apparatus includes a back plate forming unit 501, which is configured to form an LTPS back plate on a first base substrate, the LTPS back plate being provided with a switch control circuit; a microlens array forming unit 502, which is configured to form a micro-electro-mechanical system (MEMS) microlens array at a non-display region of the first base substrate, wherein the micro-electro-mechanical system (MEMS) microlens array is configured to reflect the light emitted by the light-emitting structure of the display region, and the switch control circuit is configured to control the MEMS microlens array to be turned and off; and a light-emitting structure forming unit 503, which is configured to form the light-emitting structure at the display region of the first base substrate.

According to the apparatus for manufacturing the display device, the MEMS microlens array for reflecting the light emitted by the light-emitting structure of the display region is formed at the non-display region of the first base substrate provided with the LTPS back plate, and the MEMS microlens array can be controlled to be turned on and off under the control of the switch control circuit of the LTPS back plate. As a result, the light at the peripheral region of the display region is darker than that at the display region. Compared with the relevant arts, although the pixels at the peripheral region of the display region are arranged in a stair-step shape, since a natural transition region is formed between the display region and the surrounding environment, the sawteeth phenomenon at the periphery of the image can be effectively removed. Therefore, the display quality of the image is improved.

Alternatively, the light-emitting structure is an electroluminescent structure.

Alternatively, the MEMS microlens array includes a first lower electrode, a second lower electrode, a support pillar and an upper electrode. As shown in FIG. 5-2, the microlens array forming unit 502 includes a lower electrode forming subunit 5021, which is configured to form a lower electrode pattern at the non-display region of the first base substrate; a first forming subunit 5022, which is configured to pattern the first base substrate provided with the lower electrode pattern to form a first lower electrode and a second lower electrode, wherein a gap is formed between the first lower electrode and the second lower electrode; a sacrificial layer forming subunit 5023, which is configured to form a sacrificial layer on the first base substrate provided with the first lower electrode and the second lower electrode; a second forming subunit 5024, which is configured to remove a part of the sacrificial layer to form a residual sacrificial layer and a cavity defined by the first lower electrode, the second lower electrode, the residual sacrificial layer and the LTPS back plate, wherein a width of the cavity is equal to that of the gap between the first lower electrode and the second lower electrode; a support pillar forming subunit 5025, which is configured to fill the cavity with a supporting material to form a support pillar; an upper electrode forming subunit 5026, which is configured to form an upper electrode on the first base substrate, wherein the upper electrode can reflect the light emitted from the light-emitting structure of the display region after being rotated by a preset angle under the control of the switch control circuit; and a removal subunit 5027, which is configured to remove the residual sacrificial layer to form the MEMS microlens array. Illustratively, the support material may be selected from polycrystalline silicon, silicon dioxide or aluminum.

As shown in FIG. 5-3, the apparatus further includes a first forming unit 504, which is configured to form the second base substrate on the light-emitting structure, and a second forming unit 505, which is configured to form a display device by an OLED evaporation technique and an OLED packaging technique.

For the apparatus according to the embodiments of the present disclosure, the microlens array forming unit can form the MEMS microlens array for reflecting the light emitted by the light-emitting structure of the display region at the non-display region of the first base substrate, and the MEMS microlens array can be controlled to be turned on and off under the control of the switch control circuit of the LTPS back plate. As a result, the light at the peripheral region of the display region is darker than that at the display region. Compared with the relevant arts, although the pixels at the peripheral region of the display region are arranged in a stair-step shape, since a natural transition region is formed between the display region and the surrounding environment, the sawteeth phenomenon at the periphery of the image can be effectively removed. Therefore, the display quality of the image and the user experience are effectively improved.

The specific working processes of the above device and units may refer to the previous embodiments and will be omitted herein.

The present disclosure further provides in some embodiments a display method for the display device as shown in any of FIGS. 2-1, 2-2, 2-3 and 2-4 to 2-6. Specifically, the display device includes a first base substrate; a low-temperature polysilicon (LTPS) back plate formed on the first base substrate and provided with a switch control circuit; a micro-electro-mechanical system (MEMS) microlens array formed at the non-display region; and a light-emitting structure formed at the display region of the first base substrate. The MEMS microlens array includes a first lower electrode, a second lower electrode, a support pillar and an upper electrode. As shown in FIG. 6, the display method may include the following steps: step S601: when an image is displayed, controlling voltages of the upper electrode, the first lower electrode and the second lower electrode by using the switch control circuit so as to enable the upper electrode to rotate to a position where the light from a light-emitting structure at the display region is reflected, as shown in FIG. 2-5; and step S602: when the image is not displayed, controlling voltages of the upper electrode, the first lower electrode and the second lower electrode by using the switch control circuit so as to enable the upper electrode to rotate to a position where the light from the light-emitting structure at the display region is not reflected, as shown in FIG. 2-6.

According to the display method of the embodiments of the present disclosure, voltages of the upper electrode, the first lower electrode and the second lower electrode are controlled by using the switch control circuit so as to enable the upper electrode to rotate to a position where the light from a light-emitting structure at a display region is reflected or is not reflected. As a result, the light at the peripheral region of the display region is darker than that at the display region. Compared with the relevant arts, although the pixels at the peripheral region of the display region are arranged in a stair-step shape, since a natural transition region is formed between the display region and the surrounding environment, the sawteeth phenomenon at the periphery of the image can be effectively removed. Therefore, the display quality of the image is improved.

The step of controlling the MEMS microlens array to be turned on and off by using the switch control circuit of the LTPS back plate can be realized in several methods. For example, when an image needs to be displayed, the switch control circuit may be used to apply charges of different polarities to the upper electrode and the first lower electrode so that the upper electrode and the first lower electrode can be mutually attracted to further enable the upper electrode to rotate to the position where the light from the light-emitting structure at the display region is reflected, as shown in FIGS. 2-5. In addition, the charges of a same polarity as the upper electrode can be applied to the second lower electrode so that the upper electrode and the second lower electrode repel each other and the upper electrode and the first lower electrode attract each other so as to enable the upper electrode to rotate to the position where the light from the light-emitting structure at the display region is reflected. However, when the image needs not to be displayed, the switch control circuit may be used to apply charges of different polarities to the upper electrode and the second lower electrode so that the upper electrode and the second lower electrode can be mutually attracted to further enable the upper electrode to rotate to the position where the light from the light-emitting structure at the display region is not reflected, as shown in FIG. 2-6. In addition, the charges of a same polarity as the upper electrode can be applied to the first lower electrode so that the upper electrode and the first lower electrode repel each other and the upper electrode and the second lower electrode attract each other so as to enable the upper electrode to rotate to the position where the light from the light-emitting structure at the display region is not reflected.

Therefore, step S601 may include applying charges of different polarities to the upper electrode and the first lower electrode while not applying charges to the second lower electrode, by using the switch control circuit, so as to enable the upper electrode to rotate to the position where the light from the light-emitting structure at the display region is reflected. Alternatively, step S601 may further include applying the charges of different polarities to the upper electrode and the first lower electrode while applying charges of a same polarity as the upper electrode to the second lower electrode, by using the switch control circuit, so as to enable the upper electrode to rotate to the position where the light from the light-emitting structure at the display region is reflected. The upper electrode is rotated by a preset angle in a direction close to the display region. Alternatively, the preset angle may be equal or greater than zero degree and less than or equal to 12 degrees.

Alternatively, step S602 may include applying charges of different polarities to the upper electrode and the second lower electrode while not applying the charges to the first lower electrode, by using the switch control circuit, so as to enable the upper electrode to rotate to the position where the light from the light-emitting structure at the display region is not reflected. Alternatively, step S602 may include applying charges of different polarities to the upper electrode and the second lower electrode while applying charges of a same polarity as the upper electrode to the first lower electrode, by using the switch control circuit, so as to enable the upper electrode to rotate to the position where the light from the light-emitting structure at the display region is not reflected. The upper electrode is rotated by a preset angle in a direction away from the display region, and alternatively the preset angle may be equal or greater than zero degree and less than or equal to 12 degrees.

According to the display method of the embodiments of the present disclosure, voltages of the upper electrode, the first lower electrode and the second lower electrode are controlled by the switch control circuit so as to enable the upper electrode to rotate to a position where the light from a light-emitting structure at a display region is reflected or is not reflected. As a result, the light at the peripheral region of the display region is darker than that at the display region. Compared with the relevant arts, although the pixels at the peripheral region of the display region are arranged in a stair-step shape, since a natural transition region is formed between the display region and the surrounding environment, the sawteeth phenomenon at the periphery of the image can be effectively removed. Therefore, the display quality of the image and the user experience are effectively improved.

The present disclosure further provides in some embodiments a wearable device, including the display device as shown in any of FIGS. 2-1 to 2-6.

The above are merely the preferred embodiments of the present disclosure, and are not used to limit the present disclosure. A person skilled in the art may make further modifications, equivalent substitutions and improvements within the principle and the spirit of the present disclosure, and these modifications, equivalent substitutions and improvements shall also fall within the scope of the present disclosure.

What is claimed is:

1. A display device, comprising:
    a first base substrate, which comprises a display region and a non-display region;
    a low-temperature polysilicon (LTPS) back plate formed on the first base substrate and provided with a switch control circuit;
    a micro-electro-mechanical system (MEMS) microlens array formed at the non-display region, wherein the MEMS microlens array is configured to reflect light emitted by a light-emitting structure at the display region, and the switch control circuit is configured to control the MEMS microlens array to be turned on and off; and
    the light-emitting structure at the display region.

2. The display device according to claim 1, wherein the MEMS microlens array comprises:
    a first lower electrode and a second lower electrode that are provided at the non-display region of the first base substrate with a gap formed therebetween;
    a support pillar formed on the first base substrate and provided between the first lower electrode and the second lower electrode; and an upper electrode formed on the support pillar and rotatable by a preset angle under the control of the switch control circuit so as to reflect the light from the display region.

3. The display device according to claim 1, further comprising a second base substrate formed on the light-emitting structure.

4. The display device according to claim 2, wherein the support pillar is made of polycrystalline silicon, silicon dioxide or aluminum.

5. The display device according to claim 1, wherein the light-emitting structure is an electroluminescent structure.

6. The display device according to claim 5, wherein the light-emitting structure comprises an electrode layer and a light-emitting layer made of a luminescent material.

7. The display device according to claim 1, wherein the LTPS back plate comprises a shielding layer made of metal, a buffer layer, a polysilicon layer, a gate insulation layer, an intermediate insulation layer, a passivation layer, source and drain electrodes, a gate electrode, and a planarization layer.

8. A method of manufacturing a display device, comprising:
    forming a low-temperature polysilicon (LTPS) back plate on a first base substrate, the LTPS back plate being provided with a switch control circuit;
    forming a micro-electro-mechanical system (MEMS) microlens array at a non-display region of the first base substrate, wherein the MEMS microlens array is configured to reflect light emitted by a light-emitting structure at a display region, and the switch control circuit is configured to control the MEMS microlens array to be turned on and off; and
    forming the light-emitting structure at the display region of the first base substrate.

9. The method according to claim 8, wherein the step of forming the MEMS microlens array at the non-display region of the first base substrate comprises:
    forming a lower electrode pattern at the non-display region of the first base substrate;
    patterning the first base substrate provided with the lower electrode pattern to form a first lower electrode and a second lower electrode, wherein a gap is formed between the first lower electrode and the second lower electrode;
    forming a sacrificial layer on the first base substrate provided with the first lower electrode and the second lower electrode;
    removing a part of the sacrificial layer to form a residual sacrificial layer and a cavity defined by the first lower electrode, the second lower electrode, the residual sacrificial layer and the LTPS back plate, wherein a width of the cavity is equal to that of the gap between the first lower electrode and the second lower electrode;
    filling the cavity with a supporting material to form a support pillar;
    forming an upper electrode on the first base substrate provided with the support pillar; and
    removing the residual sacrificial layer to form the MEMS microlens array.

10. The method according to claim 9, wherein the support material is selected from polycrystalline silicon, silicon dioxide or aluminum.

11. The method according to claim 8, further comprising forming a second base substrate on the first base substrate provided with the light-emitting structure; and forming the display device by an organic light-emitting diode (OLED) evaporation technique and an OLED packaging technique.

12. A display method for the display device according to claim 2, comprising:
    when an image is displayed, controlling voltages of an upper electrode, a first lower electrode and a second lower electrode by using a switch control circuit so as to enable the upper electrode to rotate to a position where light from a light-emitting structure at a display region is reflected.

13. The display method according to claim 12, further comprising:
    when the image is not displayed, controlling voltages of the upper electrode, the first lower electrode and the second lower electrode by using the switch control circuit so as to enable the upper electrode to rotate to a position where light from the light-emitting structure at the display region is not reflected.

14. The display method according to claim 12, wherein the step of controlling voltages of the upper electrode, the first lower electrode and the second lower electrode by using the switch control circuit so as to enable the upper electrode to rotate to the position where light from the light-emitting structure at the display region is reflected comprises
    applying charges of different polarities to the upper electrode and the first lower electrode while not applying charges to the second lower electrode, by using the switch control circuit, so as to enable the upper electrode to rotate to the position where light from the light-emitting structure at the display region is reflected; or
    applying the charges of different polarities to the upper electrode and the first lower electrode while applying charges of a same polarity as the upper electrode to the second lower electrode, by using the switch control circuit, so as to enable the upper electrode to rotate to the position where light from the light-emitting structure at the display region is reflected.

15. The display method according to claim 13, wherein the step of controlling voltages of the upper electrode, the first lower electrode and the second lower electrode by using the switch control circuit so as to enable the upper electrode to rotate to the position where light from the light-emitting structure at the display region is not reflected comprises
    applying charges of different polarities to the upper electrode and the second lower electrode while not applying the charges to the first lower electrode, by using the switch control circuit so as to enable the upper electrode to rotate to the position where light from the light-emitting structure at the display region is not reflected; or
    applying charges of different polarities to the upper electrode and the second lower electrode while applying charges of a same polarity as the upper electrode to the first lower electrode, by using the switch control circuit, so as to enable the upper electrode to rotate to the position where light from the light-emitting structure at the display region is not reflected.

16. The display method according to claim 14, wherein the upper electrode is rotated by a preset angle in a direction close to the display region.

17. The display method according to claim 15, wherein the upper electrode is rotated by a preset angle in a direction away from the display region.

18. The display method according to claim 16, wherein the preset angle is equal or greater than zero degree and is less than or equal to 12 degrees.

19. The display method according to claim 17, wherein the preset angle is equal or greater than zero degree and is less than or equal to 12 degrees.

20. A wearable device, comprising the display device according to claim 1.

* * * * *